(12) United States Patent
Kim et al.

(10) Patent No.: US 6,870,781 B2
(45) Date of Patent: Mar. 22, 2005

(54) SEMICONDUCTOR DEVICE VERIFICATION SYSTEM AND METHOD

(75) Inventors: Hong Kim, Austin, TX (US); Ajaykumar Thadhlani, Austin, TX (US)

(73) Assignee: Sun Microsystems, Inc., Palo Alto, CA (US)

( * ) Notice: Subject to any disclaimer, the term of this patent is extended or adjusted under 35 U.S.C. 154(b) by 212 days.

(21) Appl. No.: 10/331,683

(22) Filed: Dec. 30, 2002

(65) Prior Publication Data

US 2004/0125675 A1 Jul. 1, 2004

(51) Int. Cl.$^7$ .................................................. G11C 7/00
(52) U.S. Cl. ................................... 365/201; 716/4
(58) Field of Search .............................. 365/201; 716/4

(56) References Cited

U.S. PATENT DOCUMENTS

| | | | |
|---|---|---|---|
| 5,668,745 A | 9/1997 | Day ........................... | 364/580 |
| 6,775,810 B2 * | 8/2004 | Chang et al. ................. | 716/4 |
| 2004/0163059 A1 * | 8/2004 | Subbarayan ................... | 716/5 |

OTHER PUBLICATIONS

Josephson, Don Douglas; Poehlman, Steve; Govan, Vincent "Debug Methodology for the McKinley Processor" Paper 16.2, ITC International Test Conference 0–7803–7169–0/01 2001.

* cited by examiner

*Primary Examiner*—Anh Phung
(74) *Attorney, Agent, or Firm*—Hamilton & Terrile LLP.; Robert W. Holland

(57) ABSTRACT

A semiconductor device verification system and method isolates errors detected during verification by comparing a predetermined stimulus applied to the semiconductor device with an observed stimulus measured within the semiconductor device. If the predetermined stimulus differs from the observed stimulus, the error likely results from an inaccuracy in the verification process rather than a flaw of the semiconductor device. The observed stimulus is measured between the input circuit and the core of the semiconductor device, such as between the flip flop associated with an input pin and the logic core of a processor. An observed stimulus circuit integrated within the semiconductor device outputs the observed stimulus to an output pin for use by an error isolation engine associated with verification testing equipment.

20 Claims, 3 Drawing Sheets

|  | In | Observed | Expected | Result |
|---|---|---|---|---|
| In Pin$_1$ | 1 |  |  |  |
| Out Pin$_2$ |  | 1 | 0 | F |
| Out Pin$_3$ |  | 1 | 0 | F |

*Figure 3*

SEMICONDUCTOR DEVICE VERIFICATION SYSTEM AND METHOD

BACKGROUND OF THE INVENTION

1. Field of the Invention

The present invention relates in general to the field of semiconductor silicon device verification, and more particularly to a system and method for isolation of test environment errors from silicon errors detected during semiconductor device verification.

2. Description of the Related Art

Semiconductor devices, such as processors, are typically subjected to extensive testing and verification to debug silicon errors before commercial production begins. For instance, semiconductor processor devices are generally designed to perform logical operations on input data in order to provide expected output data. Once a design of inputs and expected outputs is complete, the design is laid out as a circuit pattern design that accepts the inputs to provide the expected outputs. Computer simulations of the circuit design are typically used to aid in verification that the circuit design will respond to inputs with the expected outputs. Processor debug begins once physical silicon devices are fabricated after the initial design is completed. Debug generally involves two major components, functional verification to verify that the processor device operates correctly at a nominal operating point, and electrical characterization to expand verification beyond the nominal operating point to make sure the device operates properly at specified electrical and environmental limits. Verification testing of a physical semiconductor device, typically done on high speed automated test equipment (ATE), allows identification and correction of semiconductor device faults.

Verification of a physical semiconductor device generally involves sending a stimulus into the device and measuring the response to the stimulus output by the device. If a predetermined stimulus results in an expected response, the physical semiconductor device has processed the input as designed. If a predetermined stimulus results in a response other than the expected response, the semiconductor device is considered to have failed to process the input as designed. For instance, functional verification initializes the processor to a known state, executes code sequences on the processor and compares the results of the instructions with simulated values or values obtained from a previous architectural reference. Functional verification uses focused cases to test areas of functionality that are risky or difficult to test and pseudo-randomly generated instructions and data for finding other functional bugs. The pseudo-random instructions are simulated in an architectural simulator and then applied to the processor under test to ensure that the architectural state from the simulator and the processor match. If a failure to match occurs in which the processor fails to process a stimulus as simulated, the diagnostic failure is typically debugged to isolate and correct the cause of the failure by analyzing the failing signatures. Electrical characterization verification often applies similar stimuli but with variations in environmental conditions and with process variation. After completion of physical verification, the semiconductor device is generally fabricated in batches and sold commercially. Complete and accurate verification of the semiconductor device reduces the occurrence of post-release bugs that are both embarrassing and costly to fix.

The test environment for silicon bring up and debug is not dependent on system limitations, but rather allows variations in voltage, frequency and temperature as well as freedom to adjust timing and voltage swings on a per-pin basis. Silicon device inputs and outputs are determined by a pattern that is generated by a simulator or even by hand to give an extremely flexible environment to characterize the silicon device and debug performance issues. One difficulty with physical silicon verification of a semiconductor device occurs when errors are caused by the verification environment rather than the semiconductor device itself. For instance, verification errors occur if the tester or system that applies stimulus to the semiconductor device either applies an incorrect stimulus or mismatches a stimulus and its expected response. An improper stimulus might be applied due to hardware or software failures in the verification environment, such as poor calibration of signals or faulty circuits that provide the stimulus to the semiconductor device. A mismatch between a predetermined stimulus and its expected response might occur if the translation of expected responses to predetermined stimulus is performed incorrectly from the computer simulation file format to the tester file format. When a diagnostic failure occurs during physical testing of a semiconductor device, test engineers generally debug the error to detect whether the error was introduced by the verification environment or the semiconductor device. Debugging of both the device and the verification environment increases the complexity and duration of the verification process.

SUMMARY OF THE INVENTION

In accordance with the present invention, a system and method are provided for isolating errors detected during verification testing of a semiconductor device that are associated with the verification environment rather than the physical silicon device. Predetermined stimulus is applied to the semiconductor device to produce an actual response from the semiconductor device. Errors are detected if the actual response for a predetermined stimulus differs from an expected response. The source of the error is isolated as originating with the verification environment by comparing the predetermined stimulus with an observed stimulus measured from within the semiconductor device. If the predetermined stimulus and the observed stimulus differ, then a verification error is indicated since the actual response of the semiconductor device was to the observed stimulus instead of the intended predetermined stimulus. If the predetermined stimulus and the observed stimulus match, then the error is isolated to a semiconductor device error or a limited set of verification errors, such as a translation error.

More specifically, an observed stimulus circuit is fabricated within the semiconductor device and interfaced with the input and output circuits of the semiconductor device. A test engine applies the predetermined stimulus to the input circuit which transmits the stimulus to a logic core for the running of designed operations on the stimulus. The logic core outputs the response to the stimulus through the output circuit to a results engine for comparison of the actual results with expected results to detect errors. The observed stimulus circuit interfaces between the input circuit and the logic core to measure the actual stimulus submitted to the logic core and outputs the observed stimulus to an error isolation engine. The error isolation engine indicates a verification error if the observed stimulus differs from the predetermined stimulus, thus allowing the debugging of the error to focus on faults introduced by the verification system and process. In one embodiment, the observed stimulus circuit is a multiplexer having an observed stimulus selector to allow selection of an observation from one of several input wire lines to be output from the observed stimulus output pin.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 3 depicts a results chart for a semiconductor device pin in, pin out and observed stimulus pin out signals.

DETAILED DESCRIPTION

Verification of a physical semiconductor device presents a complex task of submitting predetermined stimulus to the device and comparing the actual response of the device with the expected response. The accurate submission of predetermined stimulus calls for properly functioning verification equipment and precise calibration and timing of stimulus and response signals. Even small deviations from desired verification environment parameters may result in fault indications due to verification errors rather than errors in the semiconductor device. For test engineers who face the complex task of detecting and debugging semiconductor device errors, verification errors present a nuisance that delay the verification process and add unnecessary complexity. For instance, a faulty tester load board will send incorrect stimulus to the semiconductor device even though the tester indicates that a proper stimulus has been sent. Since such a fault occurs at the physical interface layer, it is difficult to detect and will tend to lead test engineers to conclude that the fault originates in the semiconductor device rather than the verification system. In order to aid in the isolation of the source of an error, the present invention observes the stimulus from within the semiconductor device thus allowing a direct comparison between the stimulus intended for the logic core of the device and the actual stimulus applied to the logic core of the device. A difference between the intended and observed stimulus indicates a verification environment fault and thus reduces the complexity and delay introduced in isolating and correcting the fault.

Figure 1:
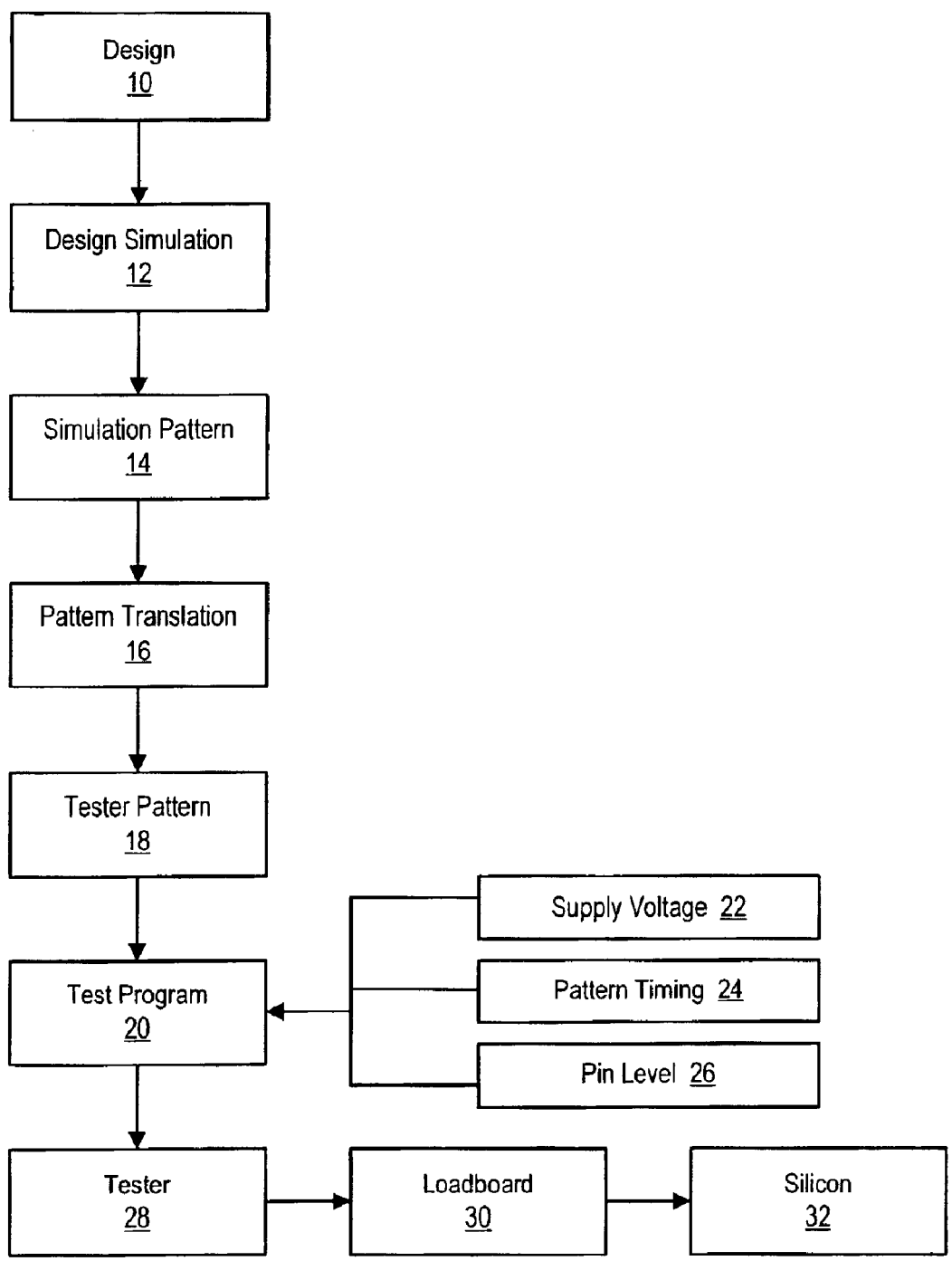
FIG. 1 depicts a flow diagram for design and verification of a semiconductor device.

Referring now to FIG. 1, a flow diagram depicts a process for verification of a semiconductor processor device. The process begins at step 10 with a semiconductor device design that performs desired functions by operating on input stimuli to generate output responses. A design simulation at step 12 applies simulated stimuli to the semiconductor processor device design to determine expected responses. The design simulation determines expected responses based on the design parameters of the semiconductor processor device and, at step 14 generates a simulation pattern. For instance, with pseudo-random testing a code generation process generates instructions in a pseudo-random fashion that are simulated in an architectural simulator, typically different from the RTL model on which the semiconductor device design was based. The architectural state of the simulation for the pseudo-random instruction and data stimuli is captured as a simulation pattern. Once a design is verified by simulation, a physical silicon device is fabricated according to the design for verification by physical testing.

At step 16, the simulation pattern results are saved, such as in a Verilog value change dump or VCD file and submitted to a pattern translation. The simulation pattern represents a set of predetermined stimulus and associated expected responses that a semiconductor processor device fabricated according to the simulated design will provide. At step 18, a tester pattern is generated to apply stimuli from the design simulation to a silicon device as a test file to run on a physical device tester. For instance, to test a physical device fabricated according to the design, the VCD file is translated into a vector format and, at step 20, included in a test program operable to run on a tester. As an example, an ATE IX9000 tester uses a vector file with a MAK extension to create and apply the predetermined stimulus of the VCD file to a physical device and to measure the actual response produced by the physical device to the predetermined stimulus. The generation of the test program at step 20 applies tester parameters such as supply voltages 22, pattern timing 24 and pin level details 26, and the test program is saved at step 28 and provided to a tester. At step 30, the tester provides stimuli to a loadboard and, at step 30, the loadboard submits the stimuli to a silicon device to measures the physical device's response to the stimuli. Errors are detected in the silicon device if a test run with a predetermined stimulus provides actual responses that differ from the expected responses associated with the predetermined stimulus.

At step 32, the silicon device under test allows analysis of detected errors to isolate test environment errors from silicon errors. Identification of the source of a detected error as related to the test environment instead of the silicon allows correction of the test environment error without unnecessary debug of the silicon device. In order to isolate errors, the process at step 32 determines if an error is a test environment verification error, i.e., it is introduced in the verification process, or a semiconductor error, i.e., an erroneous response to a stimulus is provided by the semiconductor device. Verification errors are not semiconductor device errors that require corrections to the physical semiconductor device or design, but rather relate to a failure to match a stimulus applied to a physical device with the corresponding result produced by the device. For example, verification errors may be introduced to the tester format vector file during translation from the VCD formatted file. Translation verification errors result in a verification failure of the device since the tester will mismatch stimulus and actual physical device responses. As another example, verification errors may be introduced by a faulty tester device. For instance, the test engine that sends stimulus to the physical device may simply send incorrect stimulus signals due to hardware or software faults or poor calibration. As another example, the load board that interfaces the physical semiconductor device with the tester may have a physical fault, such as a calibration error, a loose wire or a short, that prevents proper stimulus sent from the tester from reaching the semiconductor device.

Verification test environment errors are distinguished from semiconductor device errors at step 32 by comparing the predetermined stimulus applied to the semiconductor device with an observed stimulus measured within the semiconductor device. If the observed stimulus differs from the predetermined stimulus, then a verification error is indicated since the response of the semiconductor device is based on the observed stimulus, not the desired predetermined stimulus. If the observed stimulus matches the predetermined stimulus, then a verification error is not indicated since the response of the semiconductor device is based on the predetermined stimulus. Instead, a semiconductor device error is indicated since the semiconductor has provided a response to the predetermined stimulus that fails to match an expected response. Any possible verification errors responsible for such an error are more easily identified since the observed stimulus confirms that the semiconductor response was to the desired predetermined stimulus.

Figure 2:
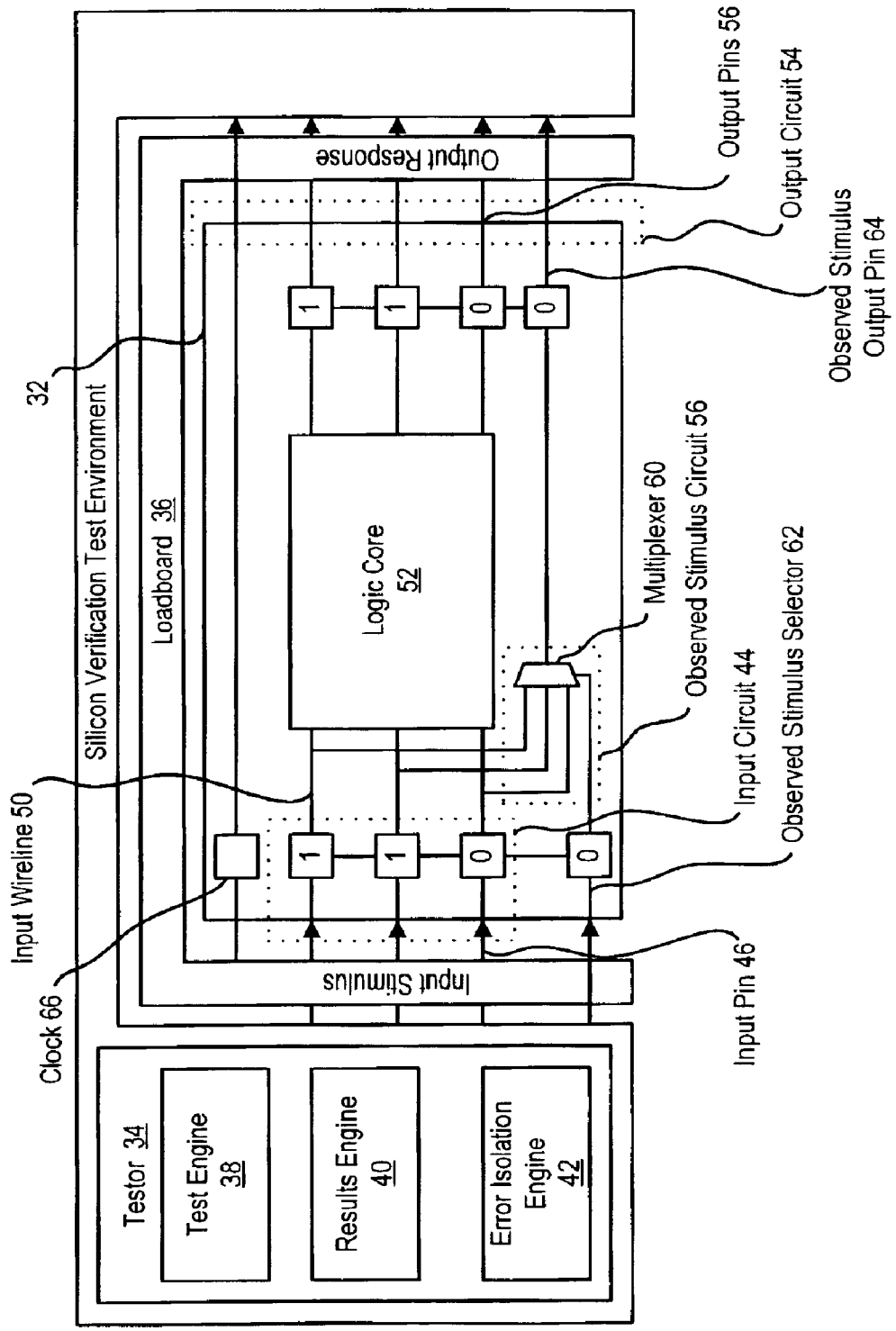
FIG. 2 depicts a block diagram of a semiconductor device tester interfaced with a semiconductor device.

Referring now to FIG. 2, a block diagram depicts a verification tester system 34 and semiconductor device 32 configured to isolate an error source as either a verification error or semiconductor device error. Verification tester system 34 provides predetermined stimulus to semiconductor device 32 through a load board 36. A test engine 38 generates predetermined stimulus from the test program and the tester format vector file and applies the predetermined stimulus to semiconductor device 32. A results engine 40 receives actual responses of semiconductor device 32 to the predetermined stimulus and compares the actual responses with expected responses to detect errors. If an actual response differs from an expected response, an error is detected and error isolation engine 42 is called to isolate the source of the error as a verification error or a semiconductor device error. Error isolation engine 42 isolates errors by obtaining observed stimulus measured from within semiconductor device 32 and comparing the observed stimulus with the predetermined stimulus applied by test engine 38. A difference between the predetermined stimulus and the observed stimulus indicates a failure by the verification system to provide the desired predetermined stimulus to the semiconductor device.

Semiconductor device 32 depicts an enlarged block diagram of a processor in order to illustrate one embodiment for obtaining observed stimulus from a physical semiconductor device during physical verification testing. Test engine 38 sends the predetermined stimulus through load board 36 and into input circuit 44 of processor 32. Input circuit 44 accepts the predetermined stimulus through one or more input pins 46 with each input pin 46 communicating with a logic core circuit 52 through a flip flop 48 and input wire line 50. Logic core circuit 52 performs logical operations based on the stimulus and outputs actual responses through output circuit 54 with the actual responses read by load board 36 from output pins 56. An observed stimulus circuit 56 includes observed circuit wire lines 58 that transfer signals from input wire lines 50 to a multiplexer 60. An observed stimulus selector 62 allows multiplexer 60 to select an observed stimulus for output to observed stimulus output pin 64. The output from observed stimulus output pin 64 allows error isolation engine to determine the stimulus actually applied through an input pin by allowing a direct observation of the value from within semiconductor device 32.

Referring now to FIG. 3, a chart depict a simplified example of data considered by tester 34 to detect errors and isolate error sources as either the silicon or the verification test environment. The simplified results chart depicts an example of a pin in, pin out and pin out observed stimulus for a test cycle of tester 34. A pin in signal entry depicts an example of data applied as a stimulus by tester 34 to an input pin 46. A pin out signal entry depicts an example of data output as a response to a stimulus from an output pin 56. A pin out observed stimulus signal entry depicts an example of data output as an observed stimulus from observed stimulus output pin 64. The observed stimulus entry is an actual measurement of the stimulus applied to logic core circuit 52 from a selected input wire line 50 while the pin in entry is the stimulus that tester 34 intends to provide to logic core circuit 52. If the pin in signal matches the observed stimulus signal, this indicates that tester 34 is providing an intended stimulus to logic core circuit 52 and that the verification environment is operating correctly. When the pin in signal matches the observed stimulus signal, the detection of an error in the response at pin out pin 56 indicates that the detected error is related to a semiconductor device fault or a limited subset of verification environment errors, such as an inaccurate translation. In contrast, if the pin in signal differs from the pin out observed stimulus signal, that indicates that the detected error is the result of a verification environment error since the intended stimulus did not get sent to logic core circuit 52. The detection of a mismatch between the sent stimulus and the observed stimulus isolates debug efforts to the verification environment since the response provided by the pin out data signal is generated from an incorrect input and thus not reliable to indicate a silicon error. This allows trouble shooting of the verification system instead of the semiconductor device, thus narrowing the debug efforts to focus on potential errors in the verification process to allow more rapid and accurate debugging.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

The above-discussed embodiments include software modules that perform certain tasks. The software modules discussed herein may include script, batch, or other executable files. The software modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A system for isolating errors detected by verification of a semiconductor device, the system comprising:
   a test engine operable to communicate a predetermined stimulus to the semiconductor device, the predetermined stimulus having an expected response;
   a results engine operable to receive an actual response from the semiconductor device for the predetermined stimulus and to detect an error by comparing the actual response with the expected response; and an error isolation engine operable to receive an observed stimulus from the semiconductor device and to isolate the error source by comparing the predetermined stimulus and observed stimulus.

2. The system of claim 1 wherein the error isolation engine isolates the error source as a verification system error.

3. The system of claim 2 wherein the verification system error comprises a load board error.

4. The system of claim 2 wherein the verification system error comprises a test engine error.

5. The system of claim 2 wherein the verification system error comprises a translator error.

6. The system of claim 1 wherein the error isolation engine isolates the error source as a semiconductor device error.

7. The system of claim 1 further comprising a semiconductor device having one or more input pins that accept the predetermined stimulus, a logic core that computes the actual response from a stimulus provided by the input pin, one or more output pins that provide the actual response to the results engine, and an observed stimulus circuit that measures the stimulus provided from the input pin to the logic core to provide the observed stimulus to the error isolation engine.

8. The system of claim 7 further comprising plural input pins, each input pin interfaced with the logic core by a wire line, the observed stimulus circuit interfaced with the wire lines to measure the observed stimulus.

9. The system of claim 8 wherein the observed stimulus circuit comprises a multiplexer having an input pin selector and an observed stimulus output, the input pin selector determining the input pin observed stimulus measured at the observed stimulus output.

10. The system of claim 1 wherein the results engine detects an error when the actual response fails to match the expected response for a predetermined stimulus and wherein the error isolation engine:

determines a verification error if the predetermined stimulus fails to match the observed stimulus; and determines a semiconductor device error if the predetermined stimulus matches the observed stimulus.

11. A method for isolating errors associated with verification of a semiconductor device, the method comprising:

providing a stimulus to the semiconductor device, the stimulus having an expected response;

observing the stimulus within the semiconductor device;

measuring the actual response of the semiconductor device to the stimulus;

detecting an error if the actual response differs from the expected response; and isolating the error source by comparing the stimulus provided to the semiconductor device and the stimulus observed within the semiconductor device.

12. The method of claim 11 wherein isolating the error source further comprises:

isolating the error source as a verification error if the stimulus provided to the semiconductor device differs from the stimulus observed within the semiconductor device.

13. The method of claim 12 wherein isolating the error source further comprises:

isolating the error source as a semiconductor device error if the stimulus provided to the semiconductor device corresponds with the stimulus observed within the semiconductor device.

14. The method of claim 11 wherein the semiconductor device comprises a processor having an input circuit, a logic circuit and an output circuit, and wherein observing the stimulus within the semiconductor device further comprises:

measuring the observed stimulus between the input circuit and the logic circuit; and outputting the observed stimulus through the output circuit.

15. The method of claim 14 wherein the input circuit comprises plural input pins, and wherein observing the stimulus within the semiconductor device further comprises:

interfacing each input pin with a multiplexer integrated in the semiconductor device;

selecting a desired input pin as the output of the multiplexer; and outputting the observed stimulus of the desired input pin from the multiplexer through the output circuit.

16. A semiconductor device comprising:

an input circuit operational to accept a stimulus;

an output circuit operational to provide a result;

a core interfaced with the input and output circuits, the core operating on the stimulus to produce the result; and an observed stimulus circuit interfaced between the core and the input circuit, the observed stimulus circuit operable to observe the stimulus provided by the input circuit to the core.

17. The semiconductor of claim 16 wherein the core comprises a processor that performs logical operations.

18. The semiconductor of claim 16 further comprising:

plural input pins;

plural input wire lines interfacing the input circuit and the core, each input wire line associated with an input pin;

an observed stimulus wire line associated with each input wire line, each observed stimulus wire line interfacing its associated input wire line with the observed stimulus circuit.

19. The semiconductor of claim 18 wherein the observed stimulus circuit comprises a multiplexer having an input selector, the input selector operable to select an observed stimulus wire line for observing the stimulus of the associated input wire line.

20. The semiconductor of claim 19 further comprising an observed stimulus output wire line interfacing the multiplexer to the output circuit for outputting the observed stimulus.

* * * * *